(12) United States Patent
Iwami et al.

(10) Patent No.: US 9,099,383 B2
(45) Date of Patent: Aug. 4, 2015

(54) SEMICONDUCTOR SUBSTRATE AND SEMICONDUCTOR DEVICE, AND MANUFACTURING METHOD OF SEMICONDUCTOR SUBSTRATE

(71) Applicants: FURUKAWA ELECTRIC CO., LTD., Chiyoda-ku, Tokyo (JP); FUJI ELECTRIC CO., LTD., Kawasaki-shi, Kanagawa (JP)

(72) Inventors: Masayuki Iwami, Yokohama (JP); Takuya Kokawa, Yokohama (JP)

(73) Assignees: FURUKAWA ELECTRIC CO., LTD., Tokyo (JP); FUJI ELECTRIC CO., LTD., Kanagawa (JP)

(*) Notice: Subject to any disclaimer, the term of this patent is extended or adjusted under 35 U.S.C. 154(b) by 18 days.

(21) Appl. No.: 13/952,649

(22) Filed: Jul. 28, 2013

(65) Prior Publication Data
US 2013/0306979 A1 Nov. 21, 2013

Related U.S. Application Data

(63) Continuation of application No. PCT/JP2012/000406, filed on Jan. 23, 2012.

(30) Foreign Application Priority Data

Feb. 3, 2011 (JP) ................................. 2011-022086

(51) Int. Cl.
*H01L 29/04* (2006.01)
*H01L 29/20* (2006.01)
(Continued)

(52) U.S. Cl.
CPC ........ *H01L 29/2003* (2013.01); *H01L 21/0254* (2013.01); *H01L 21/0262* (2013.01);
(Continued)

(58) Field of Classification Search
CPC ....... H01L 21/00; H01L 21/28; H01L 29/045; H01L 33/28
USPC ............ 257/76, E29.286, 627; 438/202, 602, 438/604
See application file for complete search history.

(56) References Cited

U.S. PATENT DOCUMENTS 7,338,826 B2 * 3/2008 Mittereder et al. ............. 438/38
2004/0224459 A1 * 11/2004 Nishikawa .................... 438/202
(Continued)

FOREIGN PATENT DOCUMENTS

| JP | 2006-140397 A | 6/2006 |
| JP | 2006-196631 A | 7/2006 |

(Continued)

OTHER PUBLICATIONS

International Preliminary Report on Patentability mailed on Aug. 15, 2013, corresponds to PCT/JP2012/000406.
(Continued)

*Primary Examiner* — Jarrett Stark
*Assistant Examiner* — Shahed Ahmed
(74) *Attorney, Agent, or Firm* — Lowe Hauptman & Ham, LLP

(57) ABSTRACT

A GaN-based semiconductor is epitaxially grown on a silicon substrate with a surface orientation of (111). The difference between the lattice constant of the GaN and the silicon (111) surface is approximately 17%, which is quite large. Therefore, the dislocation density of the grown GaN exceeds $10^{10}$ cm$^{-2}$. Screw dislocation density causes the leak current of the transistor using GaN to increases. Furthermore, the mobility of the transistor is reduced. Provided is a semiconductor substrate comprising a silicon substrate and a nitride semiconductor layer that is epitaxially grown on a (150) surface of the silicon substrate.

17 Claims, 13 Drawing Sheets

(51) Int. Cl.
  *H01L 21/02* (2006.01)
  *H01L 29/66* (2006.01)
  *H01L 29/778* (2006.01)
(52) U.S. Cl.
  CPC .... *H01L21/02381* (2013.01); *H01L 21/02433* (2013.01); *H01L 21/02458* (2013.01); *H01L 21/02488* (2013.01); *H01L 21/02499* (2013.01); *H01L 21/02505* (2013.01); *H01L 21/02507* (2013.01); *H01L 29/66462* (2013.01); *H01L 29/66522* (2013.01); *H01L 29/7787* (2013.01)

(56) References Cited

U.S. PATENT DOCUMENTS

| | | | |
|---|---|---|---|
| 2005/0106849 A1* | 5/2005 | Gwo | 438/602 |
| 2006/0006500 A1 | 1/2006 | Piner et al. | |
| 2006/0169987 A1 | 8/2006 | Miura et al. | |
| 2008/0112448 A1 | 5/2008 | Ueda et al. | |
| 2010/0172387 A1 | 7/2010 | Ueda et al. | |
| 2010/0216046 A1* | 8/2010 | D'Arrigo et al. | 429/456 |
| 2010/0295056 A1 | 11/2010 | Piner et al. | |
| 2011/0095335 A1 | 4/2011 | Ishida et al. | |
| 2013/0313565 A1* | 11/2013 | Kikkawa | 257/76 |

FOREIGN PATENT DOCUMENTS

| | | |
|---|---|---|
| JP | 2007-251144 A | 9/2007 |
| JP | 2008-505834 A | 2/2008 |
| JP | 2008-141187 A | 6/2008 |
| WO | 2010/001607 A | 1/2010 |

OTHER PUBLICATIONS

International Search Report corresponding to PCT/JP2012/000406, dated Apr. 17, 2012.

John E. Northrup; "Screw dislocations in GaN: The Ga-filled core model"; Applied Physics Letters; American Institute of Physics; Apr. 16, 2001; vol. 78, Issue 16; pp. 2288-2290.

Debdeep Jena, et al.; "Effect of scattering by strain fields surrounding edge dislocations on electron transport in two-dimensional electron gases"; Applied Physics Letters; American Institute of Physics; Jan. 7, 2002; vol. 80, Issue 1; pp. 64-66.

Extended European Search Report dated Jun. 17, 2015, corresponding to European patent application No. 12741613.9.

Reiher F et al, Metalorganic vapor-phase epitaxy of GaN layers on Si substrates with Si(110) and other high-index surfaces, Journal of Crystal Growth, Elsevier, Amsterdam, NL, vol. 312, No. 2, Jan. 1, 2010, pp. 180-184, XP026807110, ISSN: 0022-0248.

* cited by examiner

SEMICONDUCTOR SUBSTRATE AND SEMICONDUCTOR DEVICE, AND MANUFACTURING METHOD OF SEMICONDUCTOR SUBSTRATE

The contents of the following patent applications are incorporated herein by reference:
No. 2011-022086 filed in Japan on Feb. 3, 2011, and
No. PCT/JP2012/000406 filed on Jan. 23, 2012.

BACKGROUND

1. Technical Field

The present invention relates to a semiconductor substrate, a semiconductor device, and a semiconductor substrate manufacturing method.

2. Related Art

A nitride compound semiconductor has greater dielectric breakdown voltage and greater bandgap energy than a silicon semiconductor, and is therefore expected to be used as material in elements with high withstand voltage. As a device that uses a nitride compound semiconductor, an AlGaN/GaN HFET is known that achieves higher withstand voltage by doping the nitride compound semiconductor with carbon, as shown in Patent Document 1, for example.

The following are related prior art documents.
Patent Document 1: Japanese Patent Application Publication No. 2007-251144
Non-Patent Document 1: J. E. Northrup, "Screw dislocations in GaN: The Ga-filled core model", Appl. Phys. Lett., American Institute of Physics, 2001, Vol. 78, Issue 16, p. 2288 Non-Patent Document 2: Debdeep Jana, et al., "Effect of scattering by strain fields surrounding edge dislocations on electron transport in two-dimensional electron gases", Appl. Phys. Lett., American Institute of Physics, 2002, Vol. 80, Issue 1, p. 64

A gallium nitride (GaN)-based semiconductor is epitaxially grown on a silicon substrate with a surface orientation of (111), but the difference between the lattice constant of the GaN and the silicon (111) surface is approximately 17%, which is quite large. Therefore, the dislocation density of the grown GaN exceeds $10^{10}$ cm$^{-2}$. Screw dislocation and edge dislocation are types of dislocation occurring in the GaN. When the screw dislocation density increases, the leak current of the transistor using GaN increases, as shown in Non-Patent Document 1, for example. When the leak current increases, the withstand voltage of the transistor cannot be increased. When the edge dislocation density increases, the mobility in the transistor using GaN is decreased, as shown in Non-Patent Document 2, for example.

Even when the withstand voltage is increased by doping the nitride compound semiconductor with carbon, the leak current caused by spiral dislocations cannot be decreased. Furthermore, the drop in mobility caused by edge dislocations cannot be eliminated.

SUMMARY

Therefore, it is an object of an aspect of the innovations herein to provide semiconductor substrate, a semiconductor device, and a semiconductor substrate manufacturing method, which are capable of overcoming the above drawbacks accompanying the related art. The above and other objects can be achieved by combinations described in the claims.

According to a first aspect of the present invention, provided is a semiconductor substrate comprising a silicon substrate and a nitride semiconductor layer that is epitaxially grown on a (150) surface of the silicon substrate.

According to a second aspect of the present invention, provided is a semiconductor substrate manufacturing method, comprising epitaxially growing a nitride semiconductor layer, which is formed of a nitride semiconductor, on a (150) surface of a silicon substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
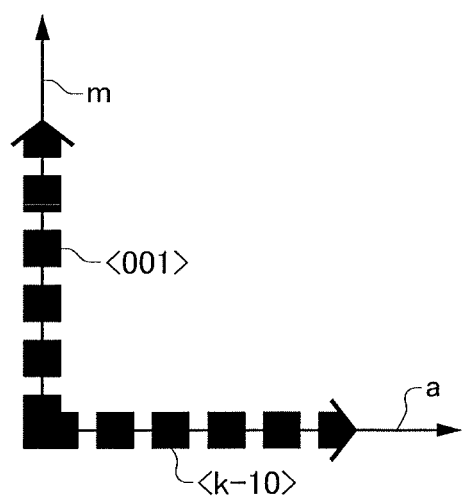
FIG. 1 shows a relationship between the crystal axes of a nitride compound semiconductor (0001) surface and a Si (1k0) surface.

FIG. 1 shows a relationship between the crystal axes of a nitride compound semiconductor (0001) surface and a Si (1k0) surface. Here, k is an integer greater than or equal to 1. The thick dotted lines represent the crystal axes of the Si (1k0) surface. The thin solid lines represent the crystal axes of the nitride compound semiconductor (0001) surface. When the nitride compound semiconductor (0001) surface is formed on the Si (1k0) surface, the Si <k-10> axis and the a-axis of the nitride compound semiconductor are matching. Furthermore, the Si <001> axis and the m-axis of the nitride compound semiconductor are matching. The nitride compound semiconductor may be GaN, AlN, or AlGaN, for example.

The difference between the intervals in the Si (001) surface and the intervals in the m-surface of the nitride compound semiconductor is 1.7%. The difference between the intervals in the Si (k-10) surface and the a-surface of the nitride compound semiconductor is generally larger. However, when the Si (1k0) surface and the nitride compound semiconductor (0001) surface are matching, matching over a large period is allowed. This is because the Si (1k0) surface has 2-fold rotational symmetry.

Figure 2:
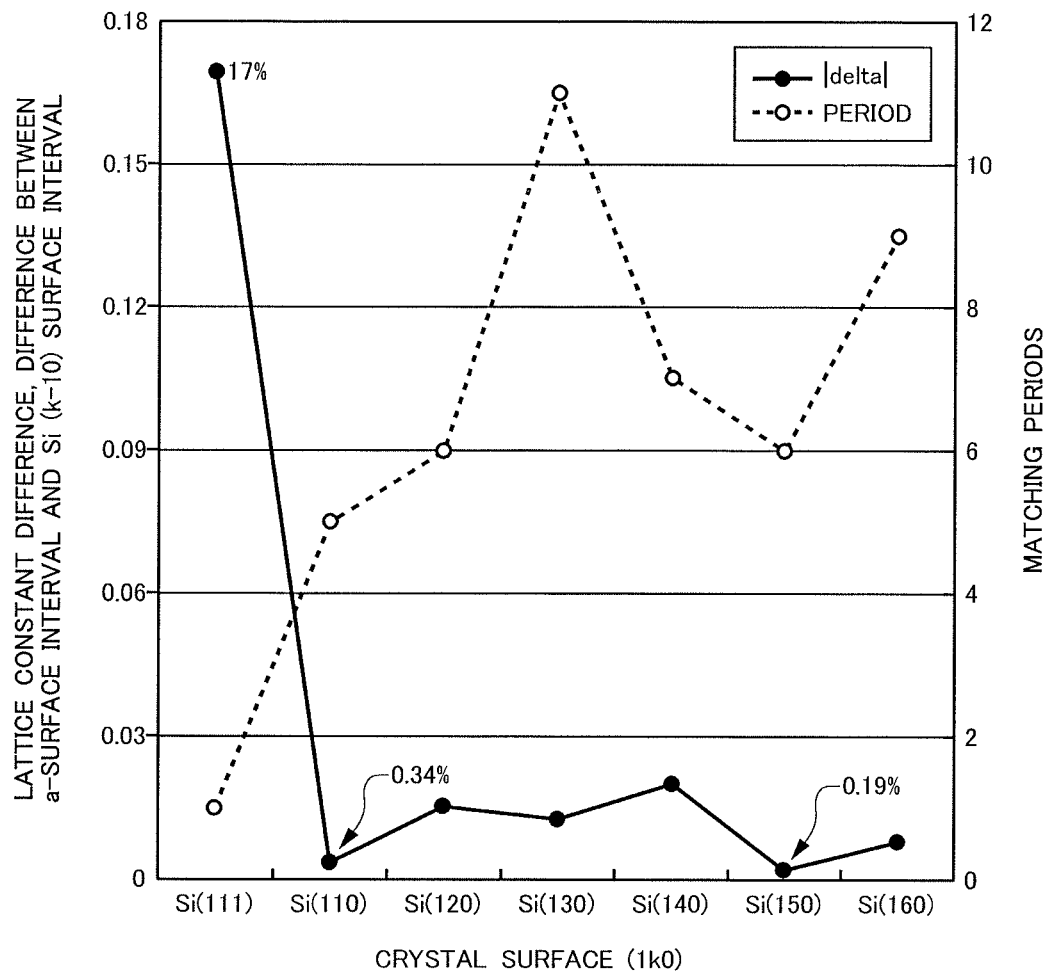
FIG. 2 is a graph of a relationship between the lattice matching and the crystal surface orientation.

FIG. 2 shows results obtained by calculating the matching amount of the lattice spacing, when the Si (1k0) surface and the GaN (0001) surface are matching. As a comparison, a case in which the Si (111) surface and the GaN (0001) surface match is also shown. In FIG. 2, the horizontal axis represents the Si surface orientation. The black circles correspond to the left axis, and indicate the value obtained when the difference between the intervals in the a-surface of the GaN and the intervals in the Si (k-10) surface is a minimum. The black circles correspond to the right axis, and indicate the number of cycles of the Si obtained when the difference between the intervals in the a-surface of the GaN and the intervals in the Si (k-10) surface is a minimum.

As shown in FIG. 2, compared to a case in which the Si (111) surface matches the GaN (0001) surface, when the intervals of the a-surface of the GaN matches the Si (k-10) surface, the lattice constant difference is small for long periods at the k=1 to 6 Si (1k0) surfaces. When Si (1k0) surfaces other than those for which k=1 to 6 are used, the matching periods are too large (12 or greater), and therefore favorable GaN crystals cannot be grown.

As shown in FIG. 2, among the Si (1k0) surfaces, when the GaN (0001) surface is formed on the Si (150) surface, the intervals in the a-surface of the GaN and the intervals in the Si (5-10) surface are at a minimum for 6 periods. At this time, the lattice spacing difference is 0.19%. Since the lattice spacing difference is small, when the GaN (0001) surface is epitaxially grown on the Si (150) surface, the resulting GaN layer has lower screw dislocation and edge dislocation (referred to collectively as "dislocation") than in a case where the GaN (0001) surface is epitaxially grown on a different Si surface. The epitaxially grown GaN has a crystal structure, and therefore a small lattice spacing difference results in reduced dislocation.

Similar results were obtained for AlN and AlGaN. In other words, when the AlN (0001) surface or AlGaN (0001) surface is epitaxially grown on the Si (150) surface, the resulting AlN layer or AlGaN layer has few dislocations.

Figure 3:
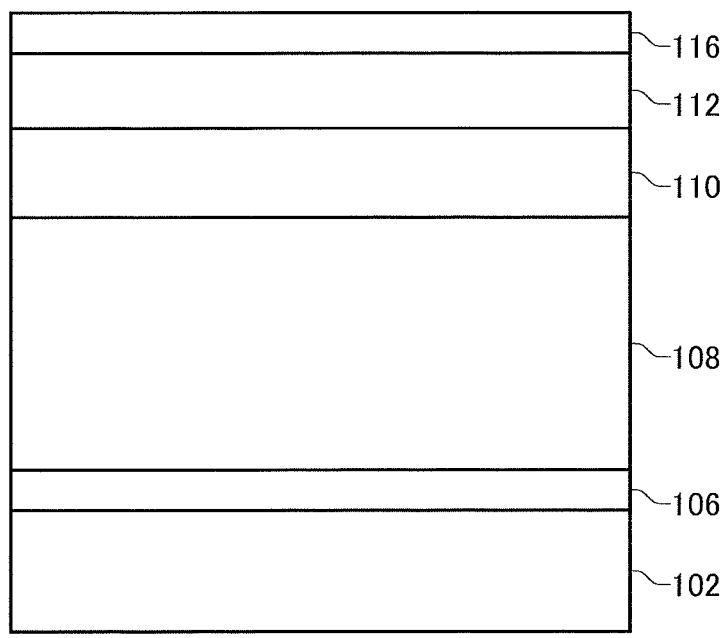
FIG. 3 is a schematic cross-sectional view of the semiconductor substrate including the silicon substrate, the MN buffer layer, the intermediate buffer layer, the GaN buffer layer, the electron transit layer, and the electron supply layer.

FIG. 3 is a schematic cross-sectional view of a semiconductor substrate 100. The semiconductor substrate 100 includes a silicon substrate 102, an AlN buffer layer 106, an intermediate buffer layer 108, a GaN buffer layer 110, an electron transit layer 112, and an electron supply layer 116.

The AlN buffer layer 106 is epitaxially grown on the (150) surface of the silicon substrate 102. The intermediate buffer layer 108 is epitaxially grown on the AlN buffer layer 106. The intermediate buffer layer 108 may be epitaxially grown by alternately layering layers formed of GaN and layers formed of AlN, starting from the silicon substrate 102 side.

The GaN buffer layer 110 is epitaxially grown on the intermediate buffer layer 108. The GaN buffer layer 110 is formed of GaN. The electron transit layer 112 is epitaxially grown on the GaN buffer layer 110. The electron transit layer 112 is formed of GaN. The electron supply layer 116 is epitaxially grown on the electron transit layer 112. The electron supply layer 116 is formed of AlGaN.

The nitride semiconductor layer formed on the semiconductor substrate 100 is epitaxially grown, and therefore has a crystal structure. In FIG. 3, the nitride semiconductor layer includes the AlN buffer layer 106, the intermediate buffer layer 108, the GaN buffer layer 110, the electron transit layer 112, and the electron supply layer 116. As shown in FIG. 2, the nitride semiconductor layer exhibits good lattice matching with the Si (150) surface, and therefore the nitride semiconductor layer has low dislocation density.

The silicon substrate 102 may be a silicon substrate with a thickness of 1 mm, grown using the CZ (Czochralski) technique. The silicon substrate grown using the CZ technique has higher residual oxygen concentration than a silicon substrate formed using the FZ technique. Furthermore, the mechanical characteristics are also different. The silicon substrate 102 grown using the CZ technique is less likely to exhibit cracking in the nitride semiconductor layer when the nitride semiconductor layer is formed, compared to a silicon substrate 102 formed using the FZ technique. For example, when the GaN buffer layer 110 and electron transit layer 112 having a total thickness exceeding 500 nm are formed on the silicon substrate 102 grown using the FZ technique, cracks occur in the nitride semiconductor layer, and therefore the combined thickness of the GaN buffer layer 110 and the electron transit layer 112 is preferably no greater than 500 nm.

The surface orientation of the silicon substrate 102 may be shifted from the (150) surface by an amount less than or equal to a prescribed skew amount. This is because, when the skew amount is small, the dislocation density of the nitride semiconductor layer formed on the silicon substrate 102 is reduced. This skew amount may be approximately equal to the error that is normally included when carving a substrate from a silicon ingot. For example, the skew amount may be no more than ±2 degrees.

The AlN buffer layer 106 may be formed of AlN with a thickness of 40 nm. The AlN exhibits good lattice matching with the Si (150) surface, and therefore the dislocation density is low. The AlN buffer layer 106 may be epitaxially grown by arranging the silicon substrate 102 in an MOCVD apparatus and introducing, into a chamber of the MOCVD apparatus, trimethylaluminum (TMAl) and $NH_3$ with respective flow rates of 175 μmol/min and 35 L/min. The growing temperature may be 1000° C., for example.

The intermediate buffer layer 108 may be formed by repeatedly layering layers formed of GaN and layers formed of AlN from 4 to 12 times, beginning from the silicon substrate 102 side. The AlN and GaN exhibit good lattice matching with the Si (150) surface, and therefore the dislocation density is low. The intermediate buffer layer 108 can restrict cracking in the epitaxial film and warping in the semiconductor substrate 100.

The GaN layers of the intermediate buffer layer 108 may have a thickness of 180 nm. The AlN layers of the intermediate buffer layer 108 may have a thickness of 20 nm. In FIG. 3, the thickness of the GaN layers is greater than the thickness of the AlN layers of the intermediate buffer layer 108 and the AlN buffer layer 106. Accordingly, the lattice matching between the GaN layers of the intermediate buffer layer 108 and the silicon has a greater effect on the dislocation density than the lattice matching between the AlN layers of the intermediate buffer layer 108 and MN buffer layer 106 and the silicon. The GaN (0001) surface and the Si (150) surface exhibit good lattice matching, and therefore the intermediate buffer layer 108 has low dislocation density.

The GaN layers of the intermediate buffer layer 108 may be epitaxially grown by introducing TMGa and $NH_3$ with respective flow rates of 58 nmol/min and 12 L/min. The AlN layers of the intermediate buffer layer 108 may be epitaxially grown by introducing TMAl and $NH_3$ with respective flow rates of 195 nmol/min and 12 L/min.

The GaN buffer layer 110 may be formed of GaN with a thickness of 600 nm. The GaN exhibits good lattice matching with the Si (150) surface, and therefore the dislocation density is low. The GaN buffer layer 110 may be epitaxially grown by introducing TMGa and $NH_3$ with respective flow rates of 58 nmol/min and 12 L/min, under a pressure of 50 Torr and with a growth temperature of 1050° C.

The electron transit layer 112 may be formed of GaN with a thickness of 100 nm. The GaN exhibits good lattice matching with the Si (150) surface, and therefore the dislocation density is low. The electron transit layer 112 may be epitaxially grown by introducing TMGa and $NH_3$ with respective flow rates of 19 nmol/min and 12 L/min, under a pressure of 200 Torr and with a growth temperature of 1050° C.

The electron supply layer 116 may be formed of AlGaN with a thickness of 30 nm. The AlGaN exhibits good lattice matching with the Si (150) surface, and therefore the dislocation density is low. The electron supply layer 116 may be epitaxially grown by introducing TMAl, TMGa, and $NH_3$ with respective flow rates of 100 nmol/min, 19 nmol/min, and 12 L/min, with a growth temperature of 1050° C. When the AlGaN of the electron supply layer 116 was evaluated through X-ray analysis, the Al composition ratio was found to be 0.22.

The semiconductor substrate 100 may be a wafer-shaped substrate. A silicon wafer may be used as the silicon substrate 102, to form a wafer-shaped semiconductor substrate 100. Instead, the semiconductor substrate 100 may be a chip-shaped substrate. A silicon chip may be used as the silicon substrate 102, to form a chip-shaped semiconductor substrate 100.

Figure 4:
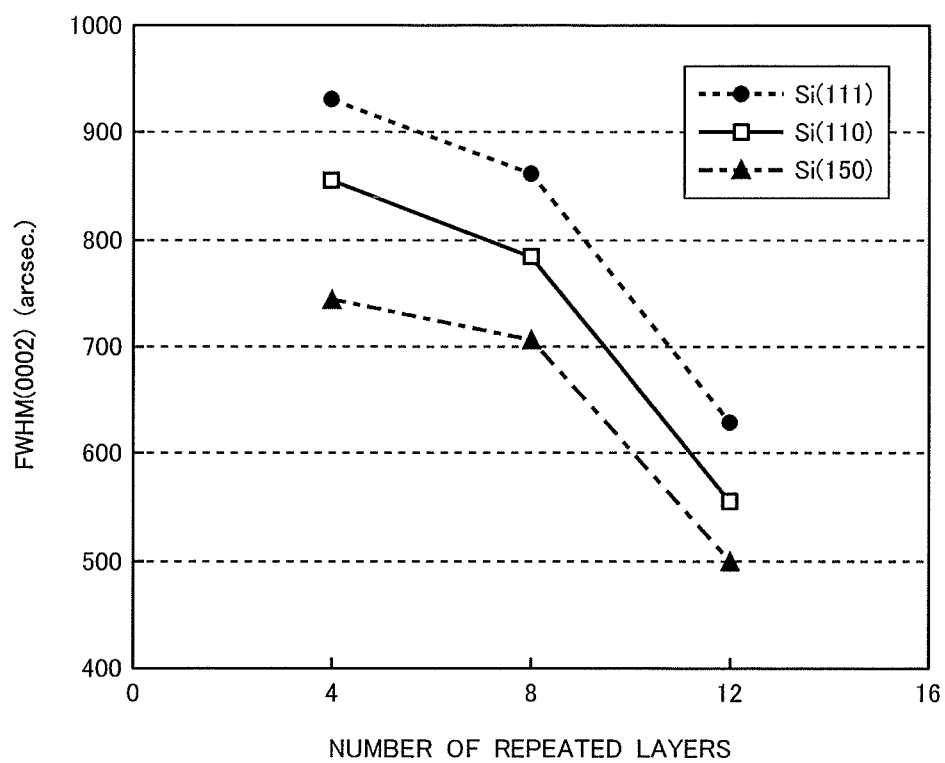
FIG. 4 is a graph showing a relationship between the number of repeated layers in the intermediate buffer layer and an FWHM of an X-ray analysis (symmetric diffraction) of the nitride semiconductor layer.

FIG. 4 shows a relationship between the number of repeated layers in the intermediate buffer layer 108 and a full width at half maximum (FWHM) of an X-ray analysis of the nitride semiconductor layer. The triangular marks indicate the FWHM of the nitride semiconductor layer of the semiconductor substrate 100 shown in FIG. 3. In other words, the triangular marks indicate the FWHM of an X-ray analysis of the nitride semiconductor layer epitaxially grown on the (150) surface of the silicon substrate 102. In the graph of FIG. 4, the nitride semiconductor layer includes the AlN buffer layer 106, the intermediate buffer layer 108, the GaN buffer layer 110, the electron transit layer 112, and the electron supply layer 116. The horizontal axis represents the number of times (referred to as "number of repetitions") that GaN layers and AlN layers are formed in the intermediate buffer layer 108. The vertical axis represents the peak FWHM with the (0002) surface as the diffractive surface, i.e. the FWHM for symmetric diffraction (0002).

In FIG. 4, the square marks represent the FWHM of the X-ray analysis of the nitride semiconductor layer formed on the (110) surface of the silicon substrate 102. The circular marks represent the FWHM of the X-ray analysis of the nitride semiconductor layer formed on the (111) surface of the silicon substrate 102.

The nitride semiconductor layer epitaxially grown on the Si (150) surface has a smaller FWHM for symmetric diffraction (0002) than the nitride semiconductor layers epitaxially grown on the Si (111) and Si (110) surfaces. Furthermore, the FWHM for symmetric diffraction (0002) decreases when the number of repetitions in the intermediate buffer layer 108 increases.

The FWHM for symmetric diffraction (0002) correlates with the screw dislocation density. Furthermore, the screw dislocation density correlates with the leak current. Accordingly, the nitride semiconductor layer epitaxially grown on the Si (150) surface can form a semiconductor device with lower screw dislocation density and lower leak current than a semiconductor device formed using a nitride semiconductor layer epitaxially grown on the Si (111) surface or the Si (110) surface. Furthermore, by increasing the number or repetitions in the intermediate buffer layer 108, a semiconductor device with lower screw dislocation density and lower leak current can be formed.

When the number of repeated layers in the intermediate buffer layer 108 is 12, the FWHM for symmetric diffraction (0002) of the nitride semiconductor layer formed on the Si (150) surface is reduced to 500 seconds. The FWHM for symmetric diffraction (0002) is 700 seconds when the number of repetitions is 8, and is 740 seconds when the number of repetitions is 4. When the nitride semiconductor layer is epitaxially grown on the (150) surface of the silicon substrate 102, the FWHM for symmetric diffraction (0002) is reduced by 20% or more compared to a case where the nitride semiconductor layer is formed on the silicon (111) layer.

Figure 5:
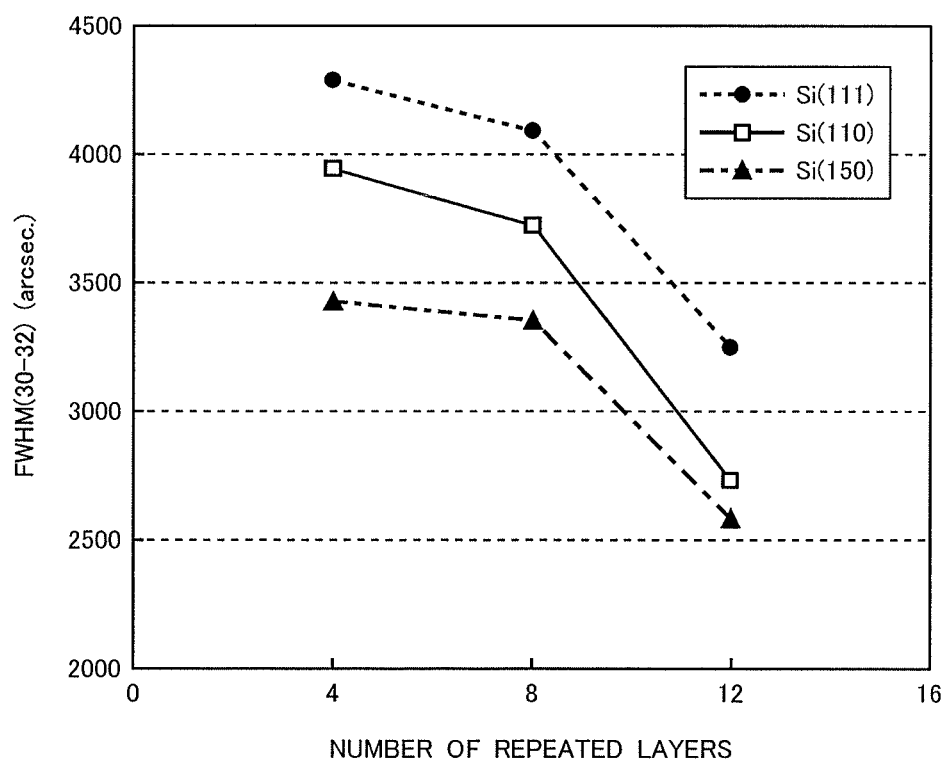
FIG. 5 shows a relationship between the number of repetitions of layers in the intermediate buffer layer and the FWHM of an X-ray analysis (asymmetric) of the nitride semiconductor layer.

FIG. 5 shows a relationship between the number of repetitions of layers in the intermediate buffer layer 108 and the FWHM of an X-ray analysis of the nitride semiconductor layer. The triangular marks indicate the FWHM of the nitride semiconductor layer of the semiconductor substrate 100. The horizontal axis represents the number of times that the layers of GaN and the layers of MN are repeatedly formed in the intermediate buffer layer 108. The vertical axis represents the peak FWHM with the (30-32) surface as the analyzed surface, i.e. the FWHM for asymmetric diffraction (30-32). The square marks indicate the FWHM of the X-ray analysis of the nitride semiconductor layer formed on the (110) surface of the silicon substrate 102. The circular marks indicate the FWHM of the X-ray analysis of the nitride semiconductor layer formed on the Si (111) surface of the silicon substrate 102.

The nitride semiconductor layer epitaxially grown on the Si (150) surface has a lower FWHM for asymmetric diffraction (30-32) than the nitride semiconductor layers formed on the Si (111) surface and the Si (110) surface. Furthermore, the FWHM for asymmetric diffraction (30-32) is reduced when the number of layers repeated in the intermediate buffer layer 108 is increased.

The FWHM for asymmetric diffraction (30-32) correlates with the edge dislocation density. The edge dislocation density correlates with the mobility. Accordingly, the nitride semiconductor layer epitaxially grown on the Si (150) surface can form a semiconductor device with lower edge dislocation density and higher mobility than a semiconductor device formed using a nitride semiconductor layer epitaxially grown on the Si (111) surface or the Si (110) surface. Furthermore, by increasing the number or repetitions in the intermediate buffer layer 108, a semiconductor device with lower edge dislocation density and higher mobility can be formed.

When the number of repeated layers in the intermediate buffer layer 108 is 12, the FWHM for asymmetric diffraction (30-32) of the nitride semiconductor layer formed on the Si (150) surface is reduced to 2550 seconds. The FWHM for asymmetric diffraction (30-32) is 3300 seconds when the number of repetitions is 8, and is 3400 seconds when the number of repetitions is 4. When the nitride semiconductor layer is epitaxially grown on the (150) surface of the silicon substrate 102, the FWHM for asymmetric diffraction (30-32) is reduced by 20% or more compared to a case where the nitride semiconductor layer is formed on the silicon (111) layer.

Figure 6:
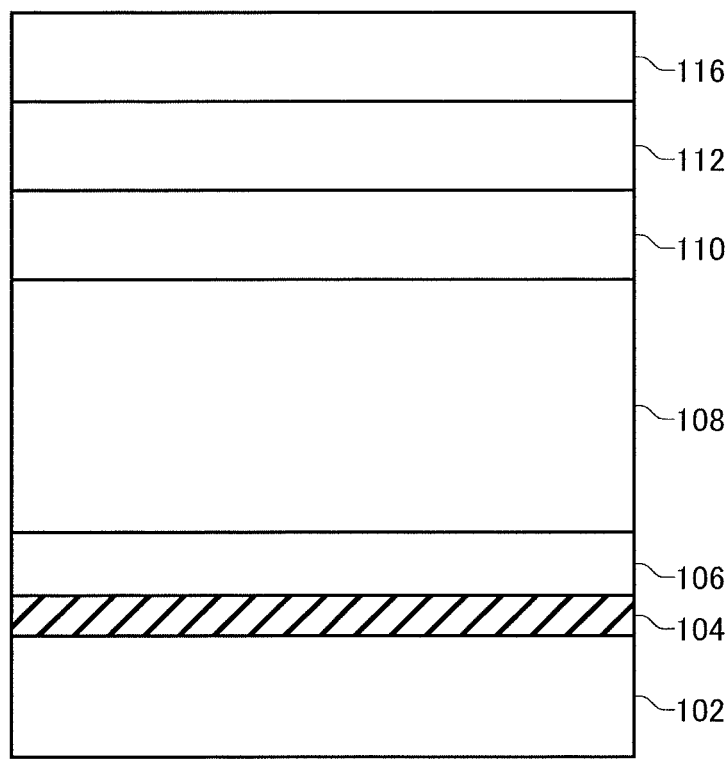
FIG. 6 is a schematic cross-sectional view of the semiconductor substrate including the silicon substrate, the SiN layer, the MN buffer layer, the intermediate buffer layer, the GaN buffer layer, the electron transit layer, and the electron supply layer.

FIG. 6 is a schematic cross-sectional view of a semiconductor substrate 130. In FIG. 6, components having the same reference numerals as components in FIG. 3 may adopt substantially the same function and configuration as these components. The semiconductor substrate 130 includes a silicon substrate 102, a SiN layer 104, an MN buffer layer 106, an intermediate buffer layer 108, a GaN buffer layer 110, an electron transit layer 112, and an electron supply layer 116. Aside from including the SiN layer 104, the semiconductor substrate 130 has the same structure as the semiconductor substrate 100 of FIG. 3.

The SiN layer 104 is formed on the silicon substrate 102. The SiN layer 104 includes N atoms in the surface thereof, thereby facilitating the epitaxial growth of the nitride semiconductor layer. The thickness of the SiN layer 104 is preferably less than or equal to two atom layers. The SiN layer 104 may have a thickness less than or equal to one atom layer. In a SiN layer 104 that is thinner than one atom layer, the entire surface of the silicon substrate 102 is covered by the SiN layer 104 with a thickness that is less than one atom layer.

The SiN layer 104 may be formed by nitriding the (150) surface of the silicon substrate 102. For example, the SiN layer 104 may be formed by arranging the silicon substrate 102 in an MOCVD apparatus and introducing, into a chamber of the MOCVD apparatus, $NH_3$ with a flow rate of 35 L/min. The SiN layer 104 may be formed through CVD.

Figure 7:
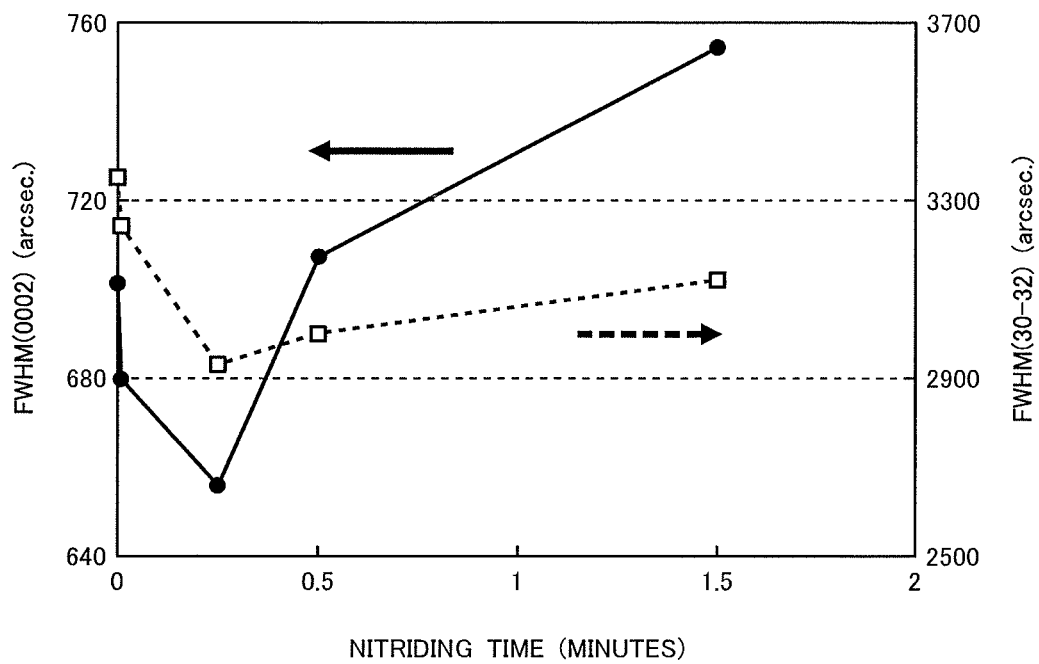
FIG. 7 is a graph showing the relationship between the FWHM and nitriding time.

FIG. 7 shows the FWHM of an X-ray analysis of the nitride semiconductor layer of the semiconductor substrate 130 shown in FIG. 6. For the graph of FIG. 7, the nitride semiconductor layer is the structure formed by layering the AlN buffer layer 106, the intermediate buffer layer 108, the GaN buffer layer 110, the electron transit layer 112, and the electron supply layer 116. The number of repetitions of layers in the intermediate buffer layer 108 is 8. The horizontal axis represents the time during which the nitriding was performed by introducing $NH_3$ into the MOCVD apparatus in which the silicon substrate 102 is placed. The left-side vertical axis represents the peak FWHM with the (0002) surface as the diffractive surface, i.e. the FWHM for symmetric diffraction (0002). The black circles correspond to the left-side axis. The right-side vertical axis represents the peak FWHM with the (30-32) surface as the diffractive surface, i.e. the FWHM for asymmetric diffraction (30-32). The white square marks correspond to the right-side vertical axis.

The FWHM for symmetric diffraction (0002) and the FWHM for asymmetric diffraction (30-32) are both minimum values at a horizontal-axis value of 0.25 minutes. The 0.25 minute value on the horizontal axis corresponds to 0.25 minutes of nitriding the silicon substrate 102 with the $NH_3$. At this time, the thickness of the SiN layer 104 is between one and two atom layers. Even if the SiN layer 104 is thinner than one to two atom layers, the FWHM is still lower than if the SiN layer 104 were not formed. Accordingly, by forming the SiN layer 104 on the surface of the Si (150) silicon surface, the semiconductor substrate 130 can be obtained for forming a semiconductor device with low leak current. Furthermore, by forming the SiN layer 104 on the surface of the Si (150) silicon surface, the semiconductor substrate 130 can be obtained for forming a semiconductor device with high mobility.

Based on the FWHM values in FIG. 7, it is understood that when the SiN layer 104 is formed with a thickness between one and two atom layers, the FWHM value is 30% or more smaller than the FWHM value obtained for the nitride semiconductor layer formed on the Si (111) surface of FIGS. 4 and 5. When the nitriding time exceeds 1.5 minutes, the effect of lowering the FWHM is reduced. In the example shown in FIG. 7, the FWHM for symmetric diffraction (0002) is large, and therefore the screw dislocation density increases and a semiconductor substrate for forming a semiconductor device with low leak current cannot be obtained.

Figure 8:
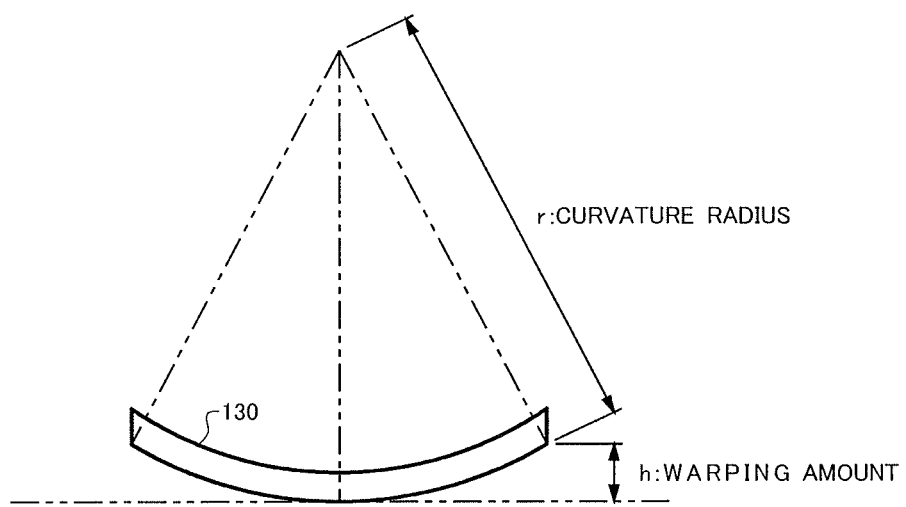
FIG. 8 is a schematic view of warping of the semiconductor substrate.

FIG. 8 shows a state for measuring warping of the semiconductor substrate 130. The semiconductor substrate 130 includes the silicon substrate 102, the SiN layer 104, the AlN buffer layer 106, the intermediate buffer layer 108, the GaN buffer layer 110, the electron transit layer 112, and the electron supply layer 116. The semiconductor substrate 130 has the configuration shown in FIG. 6. The warping amount h is the height of an end of the semiconductor substrate 130 from a horizontal plane that includes the center of the substrate. The curvature radius r is the radius of a circle tracing the bottom surface of the substrate.

The nitride semiconductor layer is formed on the (150) surface of the silicon substrate 102. The silicon substrate 102 may be a substrate with a diameter of 4 inches and thickness of 1 mm, formed using the CZ technique. The SiN layer 104 may be formed by introducing $NH_3$ with a flow rate of 35 L/min into the MOCVD apparatus in which the silicon substrate 102 is placed, at a temperature of 1000° C. The AlN buffer layer 106 may be formed of AlN with a thickness of 40 nm.

The intermediate buffer layer 108 may be formed by layering GaN layers and AlN layers in an alternating manner, six times each, beginning from the silicon substrate 102. The thickness of each layer from the GaN layer formed on the AlN buffer layer 106 to the AlN layer formed under the GaN buffer layer 110 may be as shown in the following. 290 nm (GaN), 50 nm (AlN), 330 nm (GaN), 50 nm (AlN), 390 nm (GaN), 50 nm (AlN), 470 nm (GaN), 50 nm (AlN), 580 nm (GaN), 50 nm (AlN), 740 nm (GaN), 50 nm (AlN).

The thickness of each GaN layer included in the intermediate buffer layer 108 may increase, in an order from the GaN layer closest to the silicon substrate 102 to the GaN layer farthest from the silicon substrate 102. In this way, the effect of restricting the warping and the effect of restricting cracking can be increased, and the epitaxial film can be formed to be thicker.

The GaN buffer layer 110 may be formed of GaN with a thickness of 100 nm. The GaN buffer layer 110 may be formed in the same manner as the semiconductor substrate 100 of FIG. 3. The electron transit layer 112 may be formed of GaN with a thickness of 100 nm. The electron supply layer 116 may be formed of AlGaN with a thickness of 30 nm. The results of the evaluation by an X-ray analysis indicated that the Al composition ratio was 0.23. The AlN buffer layer 106, the intermediate buffer layer 108, the GaN buffer layer 110, the electron transit layer 112, and the electron supply layer 116 may be formed in the same manner as in the semiconductor substrate 100 of FIG. 3.

Table 1 shows the warping amount h and the curvature radius r of the semiconductor substrate 130. As a comparative example, the warping amount h and the curvature radius r of a semiconductor substrate 130 in which the nitride semiconductor layer is formed on the (111) surface of the silicon. The nitride semiconductor layer formed on the (111) surface of the silicon is the same as the nitride semiconductor layer formed on the (150) surface of the silicon substrate 102. In the semiconductor substrate 130, the nitride semiconductor layer is formed of the AlN buffer layer 106, the intermediate buffer layer 108, the GaN buffer layer 110, the electron transit layer 112, and the electron supply layer 116.

TABLE 1

| | CURVATURE RADIUS r (m) | WARPING AMOUNT (μm) |
|---|---|---|
| COMPARATIVE EXAMPLE | 15.8 | 19.7 |
| SEMICONDUCTOR SUBSTRATE 130 | 65.7 | 4.8 |

The semiconductor substrate 130 in which the nitride semiconductor layer is formed on the (150) surface of the silicon substrate 102 has a smaller warping amount h and larger curvature radius than the semiconductor substrate 130 in which the nitride semiconductor layer is formed on the (111) surface of the silicon substrate 102. Accordingly, the semiconductor substrate 130 in which the nitride semiconductor layer is formed on the (150) surface of the silicon substrate 102 has reduced warping compared to the semiconductor substrate 130 in which the nitride semiconductor layer is formed on the (111) surface of the silicon.

In the semiconductor substrate 130 in which the nitride semiconductor layer is formed on the (150) surface of the silicon substrate 102, the warping amount was 15 nm or less and the curvature radius was 20 m or more. The reduction in the warping is related to low strain in the crystal, which is preferable. Furthermore, in this way, the semiconductor substrate 130 is uniformly processed when the deposition or etching is performed.

Figure 9:
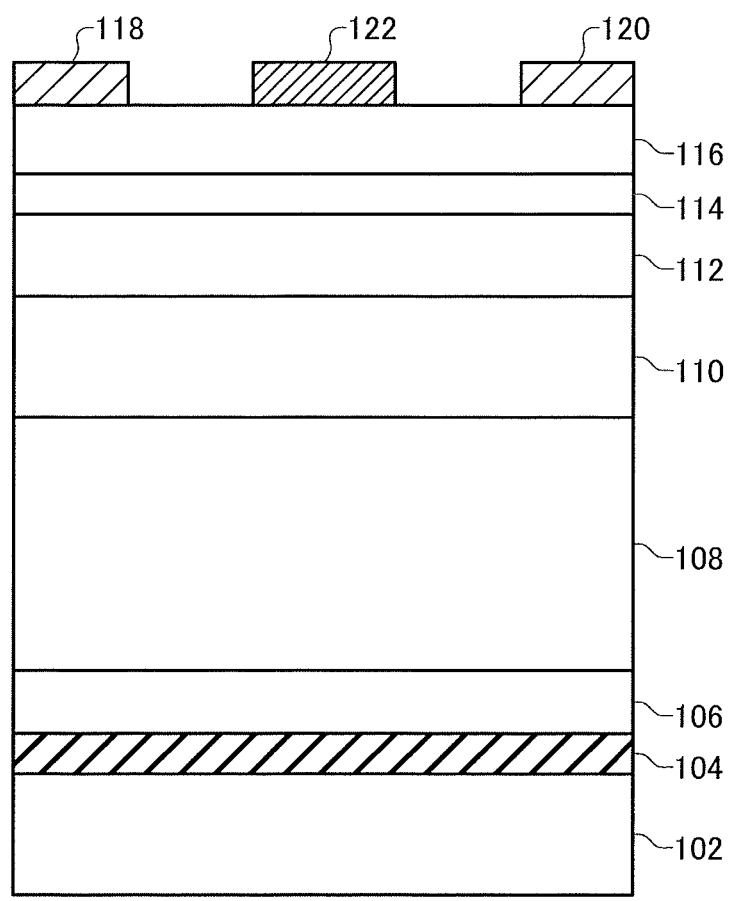
FIG. 9 is a schematic cross-sectional view of an HFET according to a first embodiment of the present invention.

FIG. 9 is a schematic cross-sectional view of an HFET 140 according to a first embodiment of the present invention. In FIG. 9, components having the same reference numerals as components in FIG. 6 may adopt substantially the same function and configuration as these components. The HFET 140 includes a silicon substrate 102, a SiN layer 104, an AlN buffer layer 106, an intermediate buffer layer 108, a GaN buffer layer 110, an electron transit layer 112, an alloy scattering restriction layer 114, an electron supply layer 116, a source electrode 118, a drain electrode 120, and a gate electrode 122.

The silicon substrate 102 is a substrate formed of silicon with a (150) surface orientation. Aside from including the alloy scattering restriction layer 114, the source electrode 118, the drain electrode 120, and the gate electrode 122, the HFET 140 has the same structure as the semiconductor substrate 130 of FIG. 6.

The alloy scattering restriction layer 114 is epitaxially grown on the electron transit layer 112. The electron supply layer 116 is epitaxially grown on the alloy scattering restriction layer 114. By forming the alloy scattering restriction layer 114 between the electron transit layer 112 and the electron supply layer 116, the alloy scattering of the two-dimensional electron gas is restricted, thereby improving mobility in the HFET 140.

The electron transit layer 112 may be formed of GaN. The alloy scattering restriction layer 114 may be formed of AlN. The alloy scattering restriction layer 114 may have a thickness of 1 nm. The electron supply layer 116 may be formed of AlGaN.

The source electrode 118, the drain electrode 120, and the gate electrode 122 are formed on the electron supply layer 116. The source electrode 118 and the drain electrode 120 may be ohmically coupled to the electron supply layer 116. The gate electrode 122 may be Schottky coupled to the electron supply layer 116. The nitride semiconductor layer is formed on the (150) surface of the silicon substrate 102, and therefore the dislocation density of the nitride semiconductor layer is low. The nitride semiconductor layer in the HFET 140 is formed of the AlN buffer layer 106, the intermediate buffer layer 108, the GaN buffer layer 110, the electron transit layer 112, the alloy scattering restriction layer 114, and the electron supply layer 116.

The SiN layer 104 may be formed by nitriding the (150) surface of the silicon substrate 102. For example, the SiN layer 104 may be formed by arranging the silicon substrate 102 in an MOCVD apparatus and introducing, into a chamber of the MOCVD apparatus, $NH_3$ with a flow rate of 35 L/min, for 0.3 minutes with a temperature of 1000° C.

The AlN buffer layer 106 may be formed of AlN with a thickness of 40 nm. The AlN buffer layer 106 may be epitaxially grown by introducing TMAl and $NH_3$ with respective flow rates of 175 nmol/min and 35 L/min. The growth temperature may be 1000° C., for example.

The intermediate buffer layer 108 may be formed by repeatedly layering GaN layers and AlN layers twelve times each, starting from the silicon substrate 102 side. Each GaN layer of the intermediate buffer layer 108 may have a thickness of 180 nm. Each AlN layer of the intermediate buffer layer 108 may have a thickness of 20 nm. The GaN layers in the intermediate buffer layer 108 may be epitaxially grown by introducing TMGa and $NH_3$ with respective flow rates of 58 nmol/min and 12 L/min. The AlN layers in the intermediate buffer layer 108 may be epitaxially grown by introducing TMAl and $NH_3$ with respective flow rates of 195 nmol/min and 12 L/min. The growth temperature for both types of layers may be 1050° C. The pressure may be 50 Torr for both types of layers.

The GaN buffer layer 110 may be formed of GaN. The GaN buffer layer 110 may be epitaxially grown by introducing TMGa and $NH_3$ with respective flow rates of 58 μmol/min and 12 L/min, under a pressure of 50 Torr and with a growth temperature of 1050° C.

The electron transit layer 112 may be formed of GaN with a thickness of 100 nm. The electron transit layer 112 functions as the electron transit layer in the HFET 140. The electron transit layer 112 may be epitaxially grown by introducing TMGa and $NH_3$ with respective flow rates of 19 μmol/min and 12 L/min, under a pressure of 200 Torr and with a growth temperature of 1050° C.

The electron supply layer 116 may be formed of AlGaN. The electron supply layer 116 may have a thickness of 32 nm. The electron supply layer 116 functions as the electron supply layer of the HFET 140. The electron supply layer 116 may be epitaxially grown by introducing TMAl, TMGa, and $NH_3$ with respective flow rates of 100 μmol/min, 19 μmol/min, and 12 L/min, with a growth temperature of 1050° C. The evaluation of the AlGaN of the electron supply layer 116 through an X-ray analysis showed that the Al composition ratio was 0.24.

The source electrode 118 and the drain electrode 120 may be formed on a layer of Ti. The source electrode 118 and the drain electrode 120 may each include an Al layer formed on the Ti layer. The Ti layer is ohmically coupled through contact with the electron supply layer 116. After formation of the source electrode 118 and the drain electrode 120, the thermal processing may be performed. Through the thermal processing, the ohmic characteristics are improved. The thermal processing may be performed for 30 minutes at a temperature of 700° C. The source electrode 118 and the drain electrode 120 may be formed by sputtering or vapor deposition.

The gate electrode 122 may be formed by a layer of Ni. The gate electrode 122 may include a layer of Au formed on the Ni layer. The Ni layer is Schottky coupled by contact with the electron supply layer 116. The gate electrode 122 may be formed by sputtering or vapor deposition.

Table 2 shows characteristics of the HFET 140 shown in FIG. 9. As a comparative example, characteristics of an HFET 140 formed on the (111) surface of the silicon substrate 102 are also shown. In the HFET 140, the gate length was set to 2 μm, the gate width was set to 200 μm, and the distance between the source and the drain was set to 15 μm. The gate length is the length of the gate electrode 122 in a direction parallel to the direction of the current flowing through the electron transit layer 112. The gate width is the width of the gate electrode 122. The distance between the source and the drain is the distance between the end of the source electrode 118 on the gate electrode 122 side and the end of the drain electrode 120 on the gate electrode 122 side. The leak current is a value obtained when the voltage between the source electrode 118 and the drain electrode 120 is 200 V.

TABLE 2

| | MOBILITY ($cm^2$/Vs) | CARRIER CONCENTRATION ($cm^{-3}$) | LEAK CURRENT (A/mm) | BREAKDOWN VOLTAGE (V) |
|---|---|---|---|---|
| HFET 140 | 1450 | $8.1 \times 10^{12}$ | $3.5 \times 10^{-8}$ | 1020 |
| COMPARATIVE EXAMPLE | 1390 | $8.1 \times 10^{12}$ | $5.0 \times 10^{-8}$ | 850 |

In the HFET 140, the (150) surface of the silicon has good lattice matching with the nitride semiconductor layer, and therefore the dislocation density is low in the epitaxially grown crystal. The HFET 140 has lower screw dislocation density than the comparative example, and therefore has lower leak current and higher breakdown voltage. Furthermore, the HFET 140 has lower edge dislocation density than the comparative example, and therefore has higher mobility. The mobility in the HFET 140 is 1400 $cm^2$/Vs or more. The leak current in the HFET 140 is $4.0 \times 10^{-8}$ A/mm or less. The breakdown voltage in the HFET 140 is 900 V or more.

Figure 10:
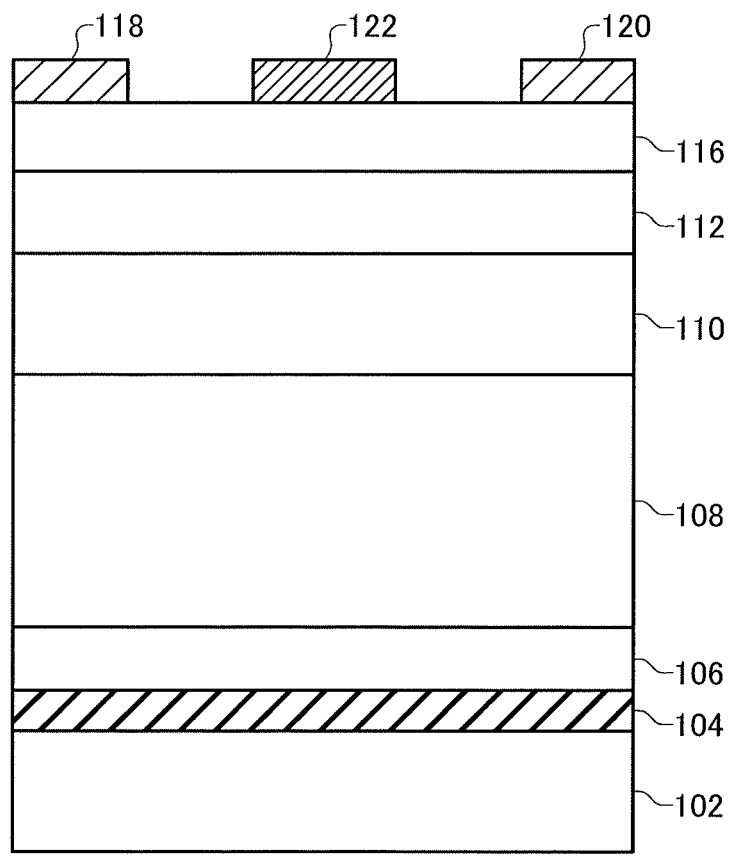
FIG. 10 is a schematic cross-sectional view of an HFET according to a second embodiment of the present invention.

FIG. 10 is a schematic cross-sectional view of an HFET 150 according to a second embodiment of the present invention. In FIG. 10, components having the same reference numerals as components in FIG. 9 may adopt substantially the same function and configuration as these components. The HFET 150 includes a silicon substrate 102, a SiN layer 104, an AlN buffer layer 106, an intermediate buffer layer 108, a GaN buffer layer 110, an electron transit layer 112, an electron supply layer 116, a source electrode 118, a drain electrode 120, and a gate electrode 122. Aside from not including the alloy scattering restriction layer 114, the HFET 150 is the same as the HFET 140 shown in FIG. 9. Since the alloy scattering restriction layer 114 is not included, the electron supply layer 116 is formed on the electron transit layer 112.

In the HFET 150, the nitride semiconductor layer is formed on the (150) surface of the silicon substrate 102, and therefore the dislocation density of the nitride semiconductor layer is low. In FIG. 10, the nitride semiconductor layer is formed of the AlN buffer layer 106, the intermediate buffer layer 108, the GaN buffer layer 110, the electron transit layer 112, and the electron supply layer 116. In the HFET 150, the (150) surface of the silicon has good lattice matching with the nitride semiconductor layer, and therefore the dislocation density is low in the epitaxially grown crystal. The HFET 150 has lower screw dislocation density than an HFET formed on the (111) surface of the silicon, and therefore has lower leak current and higher breakdown voltage. Furthermore, the HFET 150 has lower edge dislocation density than an HFET formed on the (111) surface of the silicon, and therefore has higher mobility.

Figure 11:
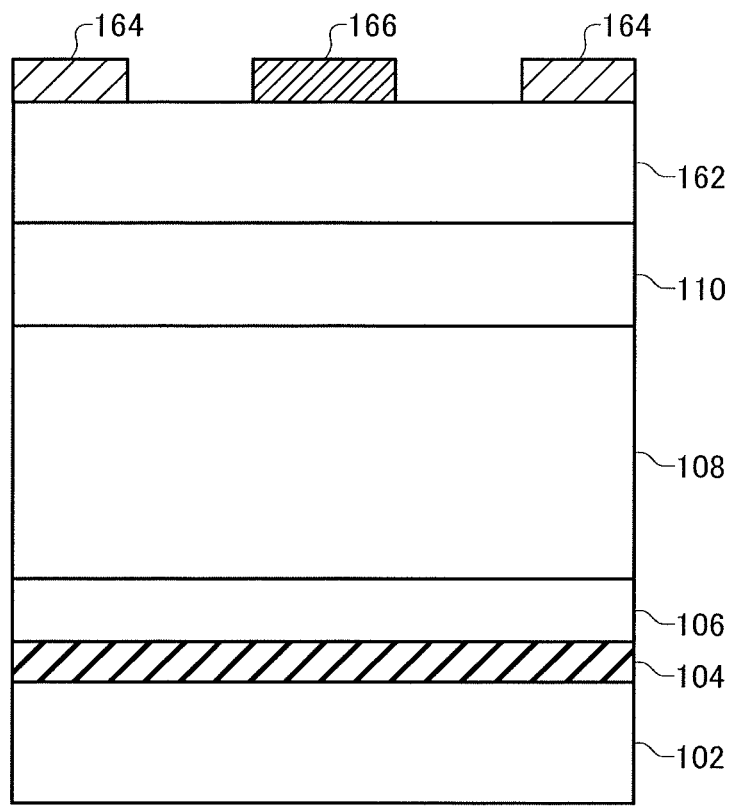
FIG. 11 is a schematic cross-sectional view of a Schottky barrier diode according to a third embodiment of the present invention.

FIG. 11 is a schematic cross-sectional view of a Schottky barrier diode 160 according to a third embodiment of the present invention. In FIG. 11, components having the same reference numerals as components in FIG. 6 may adopt substantially the same function and configuration as these components. The Schottky barrier diode 160 includes a silicon substrate 102, a SiN layer 104, an AlN buffer layer 106, an intermediate buffer layer 108, a GaN buffer layer 110, an electron transit layer 162, an ohmic electrode 164, and a Schottky electrode 166.

The silicon substrate 102 shown in FIG. 11 is a substrate formed of silicon with a (150) surface orientation. The SiN layer 104, the AlN buffer layer 106, the intermediate buffer layer 108, and the GaN buffer layer 110 have the same structure as shown in the HFET 140 of FIG. 9. The electron transit layer 162 is formed on the GaN buffer layer 110. The ohmic electrode 164 and the Schottky electrode 166 are formed on the electron transit layer 162. The ohmic electrode 164 is ohmic ally coupled with the electron transit layer 162. The Schottky electrode 166 is Schottky coupled with the electron transit layer 162.

In the Schottky barrier diode 160, the nitride semiconductor layer is formed on the (150) surface of the silicon substrate 102, and therefore the dislocation density of the nitride semiconductor layer is low. The nitride semiconductor layer in FIG. 11 includes the AlN buffer layer 106, the intermediate buffer layer 108, the GaN buffer layer 110, and the electron transit layer 162.

The electron transit layer 162 may be formed of n-GaN. The electron transit layer 162 may be formed of n-Gan doped with silicon. The carrier concentration of the electron transit layer 162 may be $2 \times 10^{16}$ $cm^{-3}$.

The electron transit layer 162 may be formed of n-GaN with a thickness of 500 nm. The electron transit layer 162 may be epitaxially grown by introducing TMGa, $NH_3$, and $SH_4$ with respective flow rates of 19 nmol/min, 12 L/min, and a prescribed amount, under a pressure of 200 Torr and with a growth temperature of 1050° C.

The ohmic electrode 164 may be formed of a Ti layer. The ohmic electrode 164 may include an Al layer formed on the Ti layer. The Ti layer is ohmically coupled through contact with the electron transit layer 162. After formation of the ohmic electrode 164, thermal processing may be performed. Through the thermal processing, the ohmic characteristics are improved. The thermal processing may be performed for 30 minutes at a temperature of 700° C. The ohmic electrode 164 may be formed by sputtering or vapor deposition.

The Schottky electrode 166 may be formed by a layer of Ni. The electron supply layer 116 may include a layer of Au formed on the Ni layer. The Ni layer is Schottky coupled by contact with the electron transit layer 162. The Schottky electrode 166 may be formed by sputtering or vapor deposition.

Figure 12:
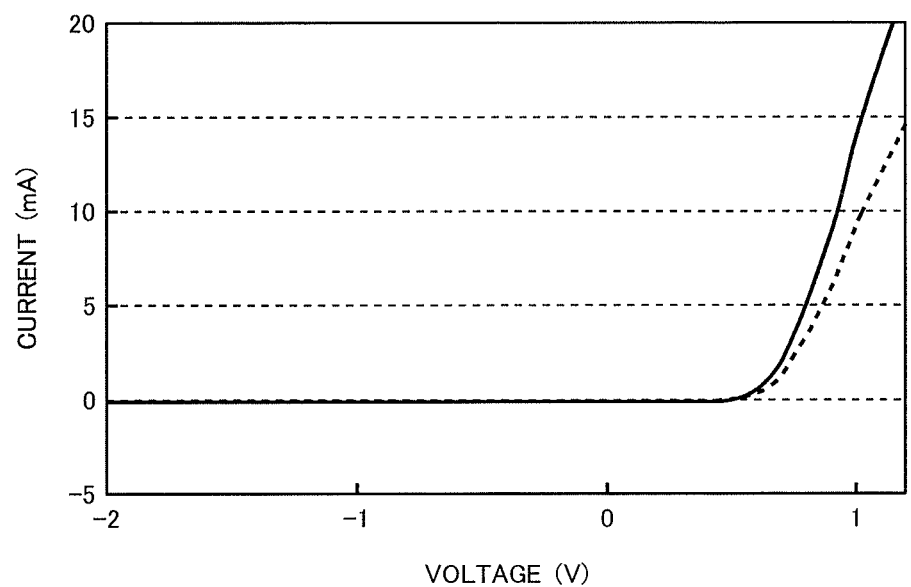
FIG. 12 is a graph showing characteristics of the Schottky barrier diode.

FIG. 12 shows characteristics of the Schottky barrier diode 160 shown in FIG. 11. The solid line corresponds to the Schottky barrier diode 160 shown in FIG. 11. The Schottky electrode 166 is a circle with a diameter of 160 nm. With an inter-electrode distance of 10 nm between the ohmic electrode 164 and the Schottky electrode 166, the ohmic electrode 164 and the Schottky electrode 166 are formed as concentric circles. As a comparative example, the dashed line shows characteristics of a Schottky barrier diode 160 formed in the same manner, except for being formed on the (111) surface of the silicon.

The Schottky barrier diode 160 shown in FIG. 11 has 1.5 times the mobility of the Schottky barrier diode 160 formed in the same manner but on the (111) surface of the silicon. In the Schottky barrier diode 160, the nitride semiconductor layer is formed on the (150) surface of the silicon substrate 102, and therefore the dislocation density is low. The effect of reducing the edge dislocation density is particularly significant. In the Schottky barrier diode 160, a current of 15 mA flowed for a voltage of 1 V.

Figure 13:
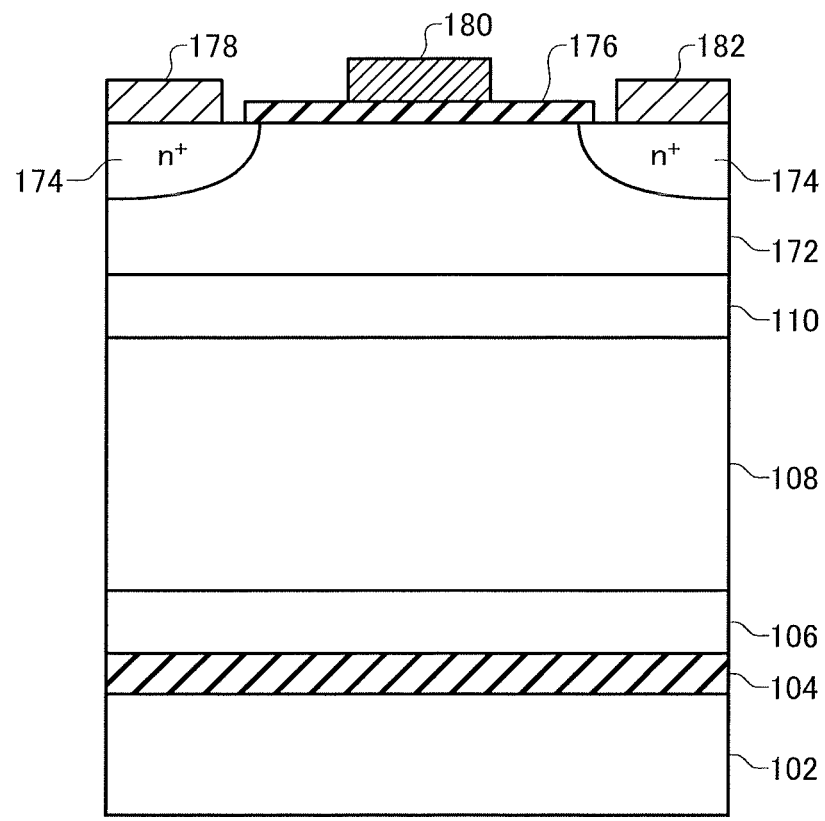
FIG. 13 is a schematic cross-sectional view of a MOSFET according to a fourth embodiment of the present invention.

FIG. 13 is a schematic cross-sectional view of a MOSFET 170 according to a fourth embodiment of the present invention. In FIG. 13, components having the same reference numerals as components in FIG. 6 may adopt substantially the same function and configuration as these components. The MOSFET 170 includes a silicon substrate 102, a SiN layer 104, an MN buffer layer 106, an intermediate buffer layer 108, a GaN buffer layer 110, an inversion layer 172, a gate oxide film 176, a source electrode 178, a gate electrode 180, and a drain electrode 182. The inversion layer 172 is formed of p-GaN. The inversion layer 172 includes a contact region 174 that contacts the source electrode 178 and the drain electrode 182 from below. In this way, the source electrode 178 and the drain electrode 182 are ohmically connected to the inversion layer 172.

The silicon substrate 102 shown in FIG. 13 is a substrate formed of silicon with a (150) surface orientation. The SiN layer 104, the MN buffer layer 106, the intermediate buffer layer 108, and the GaN buffer layer 110 have the same structure as in the HFET 140 of FIG. 9. The inversion layer 172 is formed on the GaN buffer layer 110. The gate oxide film 176 is formed on the inversion layer 172. The gate electrode 180 is formed on the gate oxide film 176.

In the MOSFET 170, the nitride semiconductor layer is formed on the (150) surface of the silicon substrate 102, and therefore the dislocation density of the nitride semiconductor layer is low. The nitride semiconductor layer shown in FIG. 13 is formed of the MN buffer layer 106, the intermediate buffer layer 108, the GaN buffer layer 110, and the inversion layer 172. The MOSFET 170 formed on the (150) surface of the silicon substrate 102 shown in FIG. 13 has a lower interface state, lower ON resistance, higher mobility, and higher withstand voltage than a MOSFET 170 formed in the same manner but on the Si (111) surface. This is due to the lower dislocation density in the nitride semiconductor layer.

The inversion layer 172 may be p-GaN doped with magnesium. The p-type dopant may be Zn or Be. The carrier concentration of the inversion layer 172 may be from $1\times10^{16}$ $cm^{-3}$ to $1\times10^{17}$ $cm^{-3}$. The thickness of the inversion layer 172 may be 300 nm.

The inversion layer 172 may be may be epitaxially grown by introducing TMGa, $NH_3$, and Bis(cyclopentadienyl)magnesium ($Cp_2Mg$) with respective flow rates of 19 nmol/min, 12 L/min, and a prescribed amount under a pressure of 200 Torr and with a growth temperature of 1050° C.

The contact region 174 may be an n+GaN region. The n+GaN is a region in which the n-type carrier concentration is higher than the n-type carrier concentration of n-GaN or the p-type carrier concentration of p-GaN. The n-type carrier concentration of the n+GaN region may be $1\times10^{18}$ $cm^{-3}$ or more. The contact region 174 may be formed by doping the inversion layer 172 with an n-type dopant. This doping may be performed by performing ion injection with the n-type dopant. The contact region 174 may be set to have a carrier concentration of $5\times10^{18}$ $cm^{-3}$ by doping the inversion layer 172 with Si at an acceleration voltage of 150 keV.

The gate oxide film 176 may be formed by an oxide film. The gate oxide film 176 may be formed of $SiO_2$. The gate oxide film 176 may be formed with a thickness from 60 nm to 100 nm. The gate oxide film 176 may be formed using plasma CVD. After forming the gate oxide film 176, heat may be applied to perform an annealing process. The annealing process decreases the interface state density at the interface between the inversion layer 172 and the gate oxide film 176. The annealing process may be performed for 30 minutes at a temperature between 800° C. and 1000° C.

The gate electrode 180 may be formed by a conductor. The gate electrode 180 may be formed of polysilicon. The source electrode 178 and the drain electrode 182 may be formed of a material that ohmically contacts the contact region 174. The source electrode 178 and the drain electrode 182 may be formed of a Ti layer. The source electrode 178 and the drain electrode 182 may include a layer of Al on the Ti layer. The Ti layer is ohmically coupled through contact with the electron transit layer 162. After forming the source electrode 178 and the drain electrode 182, thermal processing may be performed. The thermal processing improves the ohmic characteristics. The thermal processing may be performed for 30 minutes at 700° C. The source electrode 178 and the drain electrode 182 may be formed by sputtering or vapor deposition.

The distance between the gate and the source and the distance between the gate and the drain may be the same. The distance between the gate and the source is the distance between the end of the gate electrode 180 on the source electrode 178 side and the end of the source electrode 178 on the gate electrode 180 side. The distance between the gate and the drain is the distance between the end of the gate electrode 180 on the drain electrode 182 side and the end of the drain electrode 182 on the gate electrode 180 side. The distance between the gate and the source and the distance between the gate and the drain may each be 10 nm.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

100: semiconductor substrate, 102: silicon substrate, 104: SiN layer, 106: MN buffer layer, 108: intermediate buffer layer, 110: GaN buffer layer, 112: electron transit layer, 114: alloy scattering restriction layer, 116: electron supply layer, 118: source electrode, 120: drain electrode, 122: gate electrode, 130: semiconductor substrate, 140: HFET, 150: HFET, 160: Schottky barrier diode, 162: electron transit layer, 164: ohmic electrode, 166: Schottky electrode, 170: MOSFET, 172: inversion layer, 174: contact region, 176: gate oxide film, 178: source electrode, 180: gate electrode, 182: drain electrode

What is claimed is:

1. A semiconductor substrate, comprising:
   a silicon substrate; and
   a nitride semiconductor layer that is epitaxially grown on a Si (150) surface of the silicon substrate.

2. The semiconductor substrate according to claim 1, further comprising a silicon nitride layer that is formed between the silicon substrate and the nitride semiconductor layer.

3. The semiconductor substrate according to claim 2, wherein
   the silicon nitride layer has a thickness of two atom layers or less.

4. The semiconductor substrate according to claim 1, wherein
   the nitride semiconductor layer is formed of one of GaN, AlGaN, and AlN, or is formed by layering GaN, AlGaN, and AlN.

5. The semiconductor substrate according to claim 1, wherein
   a growth surface of the nitride semiconductor layer is a (0001) surface.

6. The semiconductor substrate according to claim 1, wherein
   the silicon substrate is carved from monocrystalline silicon grown using a CZ technique.

7. A semiconductor device formed on the semiconductor substrate according to claim 1.

8. The semiconductor device according to claim 7, wherein
   the nitride semiconductor layer is an electron transit layer through which electrons transit, and
   the semiconductor device is a field effect transistor.

9. The semiconductor device according to claim 8, wherein
   mobility in the field effect transistor is greater than or equal to 1400 cm$^2$/Vs.

10. The semiconductor device according to claim 7, wherein
    the semiconductor device is a Schottky barrier diode or a MOS transistor.

11. A semiconductor substrate manufacturing method, comprising:
    epitaxially growing a nitride semiconductor layer, which is formed of a nitride semiconductor, on a Si (150) surface of a silicon substrate.

12. The semiconductor substrate manufacturing method according to claim 11, further comprising, prior to epitaxially growing the nitride semiconductor layer,
    forming a silicon nitride layer by nitriding the Si (150) surface of the silicon substrate.

13. The semiconductor substrate manufacturing method according to claim 12, wherein
    the silicon nitride layer has a thickness of two atom layers or less.

14. The semiconductor substrate manufacturing method according to claim 11, wherein
    the nitride semiconductor layer is formed of one of GaN, AlGaN, and AlN, or is formed by layering GaN, AlGaN, and AlN.

15. The semiconductor substrate manufacturing method according to claim 11, wherein
    a growth surface of the nitride semiconductor layer is a (0001) surface.

16. The semiconductor substrate manufacturing method according to claim 11, further comprising:
    growing monocrystalline silicon using a CZ technique; and
    carving the silicon substrate from the grown monocrystalline silicon.

17. A semiconductor device formed on the semiconductor substrate manufactured using the semiconductor substrate manufacturing method according to claim 11.

\* \* \* \* \*